United States Patent
Sadana et al.

(10) Patent No.: US 9,835,173 B2
(45) Date of Patent: Dec. 5, 2017

(54) THERMOELECTRIC COOLING DEVICES ON ELECTRICAL SUBMERSIBLE PUMP

(71) Applicant: Baker Hughes Incorporated, Houston, TX (US)

(72) Inventors: Anil K. Sadana, Houston, TX (US); Carlos A. Prieto, Houston, TX (US); Sayantan Roy, Houston, TX (US)

(73) Assignee: Baker Hughes, a GE Company, LLC, Houston, TX (US)

(*) Notice: Subject to any disclaimer, the term of this patent is extended or adjusted under 35 U.S.C. 154(b) by 618 days.

(21) Appl. No.: 14/477,161

(22) Filed: Sep. 4, 2014

(65) Prior Publication Data

US 2015/0064032 A1 Mar. 5, 2015

Related U.S. Application Data

(60) Provisional application No. 61/874,089, filed on Sep. 5, 2013.

(51) Int. Cl.
| | |
|---|---|
| *F04D 29/58* | (2006.01) |
| *F04D 13/10* | (2006.01) |
| *F25B 21/02* | (2006.01) |
| *H01L 35/00* | (2006.01) |
| *H02K 9/22* | (2006.01) |

(52) U.S. Cl.
CPC ......... *F04D 29/5806* (2013.01); *F04D 13/10* (2013.01); *H01L 35/00* (2013.01); *F25B 21/02* (2013.01); *F25B 2321/0252* (2013.01); *H02K 9/22* (2013.01); *Y10T 29/4935* (2015.01)

(58) Field of Classification Search
CPC .... F04D 13/10; F04D 29/588; F04D 29/5806; F25B 21/02; F25B 2321/0252; H01L 35/00; Y10T 29/4935; H02K 9/22
See application file for complete search history.

(56) References Cited

U.S. PATENT DOCUMENTS

| | | | |
|---|---|---|---|
| 5,618,167 A * | 4/1997 | Hirakawa | F04D 19/04 415/178 |
| 7,188,669 B2 | 3/2007 | Bullock et al. | |
| 7,492,069 B2 | 2/2009 | Knox et al. | |
| 8,358,043 B2 | 1/2013 | Tetzlaff et al. | |
| 8,435,015 B2 | 5/2013 | Brookbank et al. | |
| 8,696,327 B2 | 4/2014 | Forsberg | |
| 8,708,675 B2 | 4/2014 | Martinez et al. | |

(Continued)

OTHER PUBLICATIONS

"Thermoelectric Cooler Application in Electronic Cooling", Chein and Huang, (2004), Applied Thermal Engineering 24 (2004) pp. 2207-2217.

(Continued)

*Primary Examiner* — Dominick L Plakkoottam
(74) *Attorney, Agent, or Firm* — Bracewell LLP; James E. Bradley

(57) ABSTRACT

An electric submersible well pump assembly includes a pump and an electrical motor filled with a dielectric lubricant. A capsule extends around a portion of the motor, defining a chamber between the capsule and the motor. A port through a side wall of the motor communicates the lubricant within the motor to the chamber. Thermoelectric devices are located within the chamber. Voltage supplied to the thermoelectric devices cools the lubricant.

20 Claims, 3 Drawing Sheets

(56) References Cited

U.S. PATENT DOCUMENTS

| | | | | |
|---|---|---|---|---|
| 8,740,586 B2* | 6/2014 | Martinez | ............... | F04D 13/10 166/62 |
| 2006/0162931 A1* | 7/2006 | Mayes | ............... | E21B 47/011 166/302 |
| 2010/0146990 A1* | 6/2010 | Taras | ............... | F04B 35/04 62/3.2 |
| 2012/0155504 A1* | 6/2012 | Jarvie | ............... | G01N 25/02 374/16 |
| 2012/0274256 A1* | 11/2012 | O'Rourke | ............... | H02K 9/06 318/473 |

OTHER PUBLICATIONS

"Thermoelectric Cooler Modules", Peltier, https://tetech.com/peltier-thermoelectric-cooler-modules/, retrieved Apr. 2006.

Thermoelectric Materials: "Smaller is Cooler", Brian C. Sales—Vo. 295, No. 5558, pp. 1248-1249, retrieved Apr. 2006, http://www.sciencemag.org/cgi/content/full295/5558/1248.

"Thermoelectric-Powered Convective Cooling of Microprocessors". Yazawa, Soibrekken, and Bar-Cohen, IEEE Transactions of Advanced Packaging, vol. 28, No. 2, May 2005.

"Application of Thermoelectric Cooling to Electronic Equipment: A Review and Analysis", Simons and Chu, IEEE Semi-Therm Symposium. 2000, pp. 1-9.

"Thermoelectrics and the 12 Most Frequently Asked Questions About Thermoelectric Cooling", retrieved May 2006, http://www.tellurex.com/12most.html TE Technology, Inc. (2005).

"Semiconductor", retrieved May 2006. http://en.wikipedia.org/wiki/Semiconductor.

"Condensation", retrieved May 2006. http://en.wikipedia.org/wiki/Condensation.

"The Effectiveness of Water Vapor Sealing Agents When Used in Application with Thermoelectric Cooling Modules", Nagy (1997)—16th International Conference on Thermoelectrics.

"Thermoelectric Cooler Selection Procedure", retrieved Jun. 2006, http://www.marlow.com/TechnicalInfo/thermoelectric_coolar_selection_p.htm Nagy. J.(1997).

"Advances in High-Performance Cooling for Electronics", Lasance, C. J.M. and Simmons, R.E. (2005), retrieved May 2006—http://www.electronics-cooling.com/html/2005_nov_article2.html Moller (2003).

* cited by examiner

THERMOELECTRIC COOLING DEVICES ON ELECTRICAL SUBMERSIBLE PUMP

CROSS REFERENCE TO RELATED APPLICATION

This application claims priority to provisional application Ser. No. 61/874,089, filed Sep. 5, 2013.

FIELD OF THE DISCLOSURE

This disclosure relates in general to electrical submersible pumps for wells particular to thermoelectric cooling devices mounted on the motor of the pump.

BACKGROUND

One method for producing liquid from a hydrocarbon well employs an electrical submersible pump (ESP) located within the well. The ESP includes an electrical motor that drives the pump. The motor has a stator with windings that are supplied with three-phase power, inducing an electromagnetic field that causes a rotor and drive shaft to spin. A dielectric lubricant fills the motor. A seal section or pressure equalizer mounts to the motor and has a pressure compensating member that equalizes the pressure of the lubricant with the hydrostatic pressure of well fluid in the well.

Operating the motor causes heat to be generated in the windings. Also, the temperature of the well fluid in some wells can be quite high. The temperatures of the windings have a direct impact on the degradation rate of insulating materials in the motor. Preventing the motor from excessive heating is an important goal.

Various proposals have been made to mitigate degradation of the insulating materials. Those proposals include mounting a lubricant pump in the motor and circulating the dielectric fluid. Fins on the exterior of the motor have been proposed to increase heat transfer from the motor to the surrounding well fluid. Another technique involves lubricant circulation tubes on the exterior of the motor. For subsea applications, one proposed technique is to employ an external heat exchanger that is submersed in the sea. The dielectric lubricant circulates through the heat exchanger. High temperature insulation materials may be used.

SUMMARY

An electric submersible well pump assembly includes a pump and an electrical motor operatively connected to the pump for lowering into a well along with the pump. At least one thermoelectric device is mounted to an exterior portion of the motor. The thermoelectric device provides cooling upon receiving electrical current. The voltage differential applied causes a cooler surface to occur on one side of the thermoelectric device.

In one embodiment, a capsule is mounted to the exterior portion of the motor and encloses the thermoelectric device. Preferably, the capsule is sealed to the motor, defining a chamber between the motor and the capsule containing the thermoelectric device. A port extends through a side wall of the motor, communicating lubricant within the motor to the chamber. An optional lubricant pump in the motor circulates the lubricant between the motor and the chamber.

Preferably, the thermoelectric device has an inner side in contact with the exterior portion of the motor. A plurality of thermoelectric devices may be employed. The thermoelectric devices are spaced apart from each other around the exterior portion of the motor. The thermoelectric devices may be in rows, each of the rows extending circumferentially around the exterior portion of the motor.

The thermoelectric device comprises a semi-conductor member that exhibits cooling in response to the application of DC electrical current. The thermoelectric device functions in accordance with the Peltier Effect.

An electrical power cable extends alongside the pump to the motor. The power cable connects to a power source at a wellhead for supplying power to the motor and to the thermoelectric device.

BRIEF DESCRIPTION OF THE DRAWINGS

The present technology will be better understood on reading the following detailed description of nonlimiting embodiments thereof, and on examining the accompanying drawings, in which.

DETAILED DESCRIPTION OF THE DISCLOSURE

Figure 1:
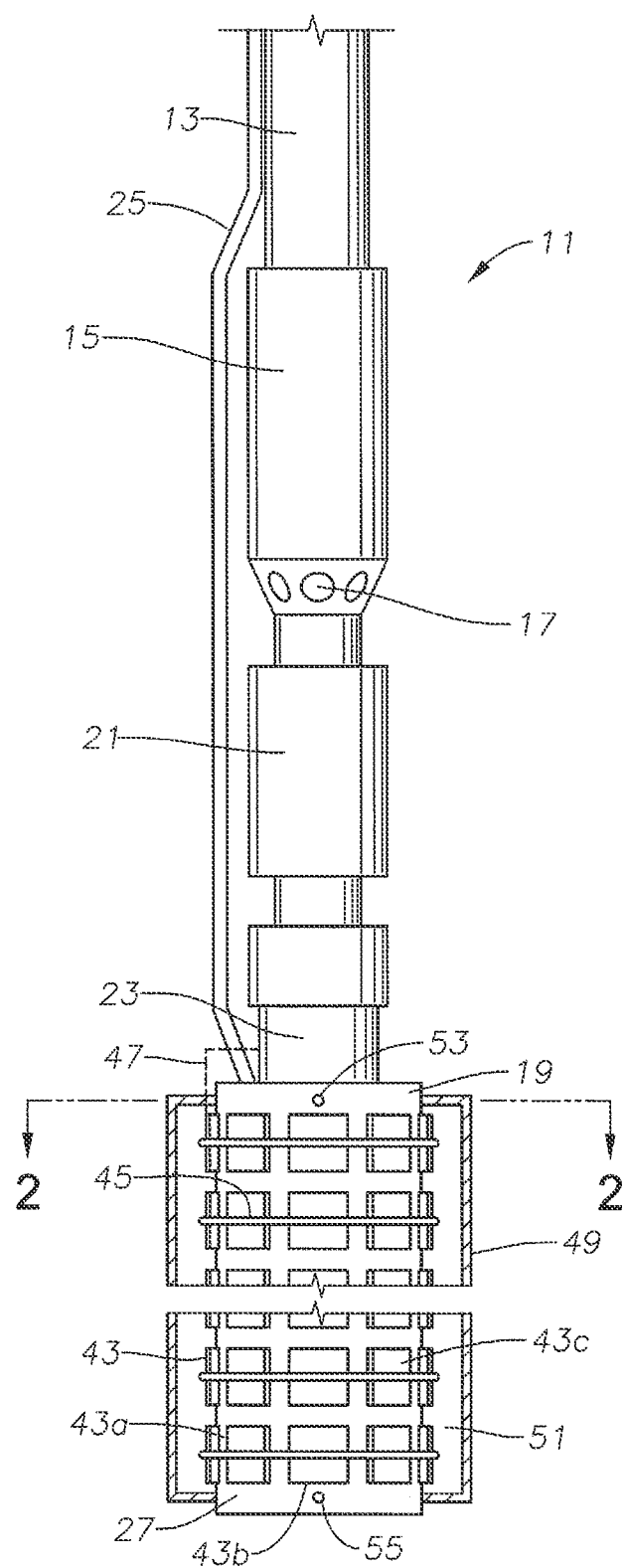
FIG. 1 is a partially sectioned side view of an electric submersible pump assembly having a motor with thermoelectric cooling devices in accordance with this disclosure.

The foregoing aspects, features, and advantages of the present technology will be further appreciated when considered with reference to the following description of preferred embodiments and accompanying drawings, wherein like reference numerals represent like elements. In describing the preferred embodiments of the technology illustrated in the appended drawings, specific terminology will be used for the sake of clarity. However, it is to be understood that the specific terminology is not limiting, and that each specific term includes equivalents that operate in a similar manner to accomplish a similar purpose.

Referring to FIG. 1, electrical submersible pump assembly (ESP) 11 is illustrated as being supported on production tubing 13 extending into a well. Alternately, ESP 11 could be supported by other structure, such as coiled tubing. Although shown vertical, ESP 11 could be within inclined or horizontal portions of a well. ESP 11 includes several modules, one of which is a rotary pump 15 that is illustrated as being a centrifugal pump. Alternately, pump 15 could be another type, such as a progressing cavity pump or a reciprocating pump. Pump 15 has an intake 17 for drawing in well fluid. Another module is an electrical motor 19, which drives pump 15 and is normally a three-phase AC motor.

A third module comprises a protective member or seal section 21, normally coupled between pump 15 and motor 19. Seal section 21 has components, such as a bladder or bellows, to reduce a pressure differential between dielectric lubricant contained in motor 19 and the pressure of the well fluid on the exterior of ESP 11. Intake 17 may be located in an upper portion of seal section 21 or on a lower end of pump 17. A thrust bearing 23 for motor 19 may be in a separate module or located in seal section 21 or motor 19. A power cable 25 extends from the wellhead alongside and is strapped to tubing 13. Power cable 25 includes a motor lead extension on its lower end that extends alongside pump 15 and seal section 21 and joins an electrical connection at the upper end of motor 19.

ESP 11 may also include other modules, such as a gas separator for separating gas from the well fluid prior to the well fluid flowing into pump 15. The various modules may be shipped to a well site apart from each other, then assembled with bolts or other types of fasteners.

Figure 2:
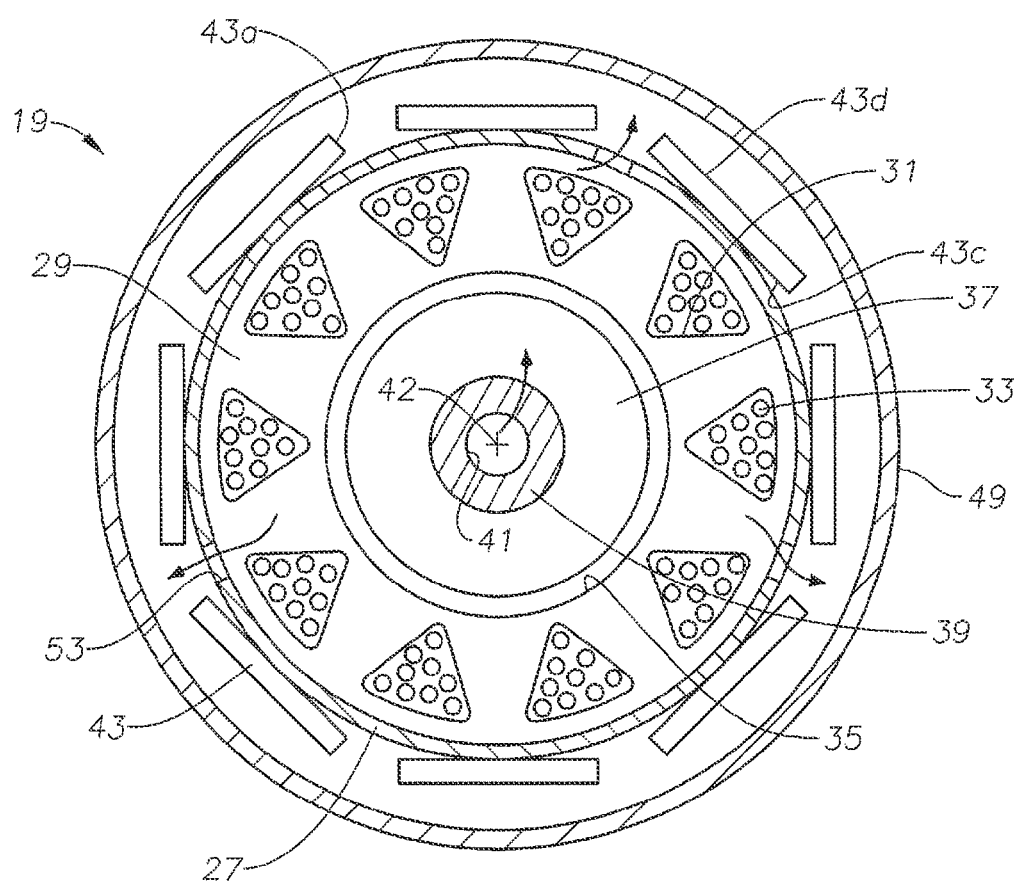
FIG. 2 is a cross-sectional view of the motor of FIG. 1 taken along the line 2-2 of FIG. 1.

Motor 19 has a cylindrical, tubular housing 27 with a length much longer than its diameter. For example, the outer diameter may be about 5 inches and the length 30 feet or more. As shown in FIG. 2, motor 19 includes a stator 29 stationarily mounted in housing 27. Stator 29 is made up of a large number of thin, electrically conductive laminations or disks stacked on each other. Each disk has a number of slots 31 that extend around stator 29. Electrically conductive motor windings 33 wind through slots 31 and electrically connect with power cable 25 (FIG. 1). Stator 29 has an inner diameter 35 that surrounds but does not contact a rotor 37. Rotor 37 also comprises electrically conductive disks or laminations. Rotor 37 is typically made up of short sections, about 1 to 2 feet in length, separated by radial bearings (not shown) that engage stator inner diameter 35. Copper rods or bars (not shown) are spaced around and extend longitudinally through the disks of each rotor section. The various sections of rotor 37 mount to a shaft 39 for rotating shaft 39 in response to an electromagnetic field generated by stator 29. Shaft 39 in turn drives pump 15 (FIG. 1).

Shaft 39 may have a central passage 41 extending the length of motor 19 along shaft axis 42. A dielectric liquid lubricant fills motor 19, immersing stator 29 and rotor 37 and filling shaft passage 41. Shaft passage 41 may have lateral branches (not shown) that lead to the various radial bearings (not shown).

Referring again to FIG. 1, thermoelectric devices 43 are mounted to the exterior of motor housing 27. Thermoelectric devices 43 operate on the Peltier effect to create a temperature difference in response to a direct current voltage applied. Thermoelectric devices of this nature are commercially available. Each thermoelectric device 43 is a single piece, solid member made up of a suitable Peltier effect material. One suitable material is bismuth telluride, which is a semiconductor that provides an efficient thermoelectric material when alloyed with antimony or selenium. Due to the Peltier effect, one surface of a thermoelectric device becomes hotter and the opposite surface cooler when a voltage gradient is applied. The cooler side can absorb heat, and heat flow occurs through the cross-section of the thermoelectric device from the cooler side to the hotter side.

In the example shown, each thermoelectric device 43 is rectangular, having two parallel side edges 43a, parallel top and bottom edges 43b, and flat inner and outer sides 43c, 43d (FIG. 2). The thickness between inner and outer sides 43c, 43d can be quite thin, such as 0.010 to 0.015 inch. Each thermoelectric device 43 is illustrated as having a length of a few inches, much shorter than the length of motor 19. Thermoelectric devices 43 are spaced circumferentially around motor 19 with their inner sides 43c tangent and in physical contact with the exterior of motor housing 27. The side edges 43a of adjacent thermoelectric devices 43 do not touch each other in this example. Because of the much shorter length, thermoelectric devices 43 are mounted in rows perpendicular to shaft axis 42 and in columns parallel with shaft axis 42. The top and bottom edges 43b of thermoelectric devices in adjacent rows are not touching each other in this embodiment. Preferably, the array of thermoelectric devices 43 extends at least from the upper end to the lower end of stator 29 to remove heat generated by windings 33.

Alternately, thermoelectric devices 43 could have a curvature to match the circumference of motor housing 27, and be semi-cylindrical or even fully cylindrical. Also, the lengths of thermoelectric devices 43 could be the same as the length of motor housing 27, rather than having multiple circumferentially extending rows.

Thermoelectric devices 43 may be attached to motor housing 27 in various manners. For example, inward biased retainer clips 45 are shown extending around each circumferential row of thermoelectric devices 43. Each clip 45 may comprise a split ring. Alternately, inner sides 43c could be bonded to the exterior of motor housing 27. Inner sides 43c comprise the cooler sides of thermoelectric devices 43 and are preferably in physical contact with the exterior of motor housing 27.

A motor lead extension or wire 47 extending from power cable 25 may transfer DC power superimposed on the three-phase AC power cable 25. Thermoelectric devices 43 may electrically connect in parallel to wire 47. Rather than receiving power from the three-phase conductors of power cable 25, a dedicated wire may extend from the surface to thermoelectric devices 43.

Thermoelectric devices 43 are fragile, thus to avoid damage to them while lowering ESP 11 in the well, a container or capsule 49 encloses them. Capsule 49 is a metal, tubular member that has a length approximately the same as motor 19. Capsule 49 surrounds motor 19 and the thermoelectric devices 43 mounted to motor housing 27. Capsule 49 has an inner diameter that is greater than any portion of the outer sides 43d of thermoelectric devices 43, thus does not touch them. Preferably the upper and lower ends of capsule 49 seal to the exterior of motor 21, defining a sealed chamber 51 that is sealed from well fluid in the well and contains all of the thermoelectric devices 43. Thermoelectric devices 43 are thus protected from contact with well fluid, which can be corrosive. Wire or wires 47 extends sealingly through capsule 49 into electrical connection with each of the thermoelectric devices 43.

In the preferred embodiment, the dielectric lubricant of motor 19 is in fluid communication with and fills capsule chamber 51. Thermoelectric devices 43 are thus immersed in the dielectric lubricant. The fluid communication may be provided by one or more ports through the side wall of motor housing 27, such as upper ports 53 and lower ports 55. Upper ports 53 are located near the upper end of capsule 49. Lower ports 55 are near the lower end of capsule 49. As mentioned above, seal section 21 (FIG. 1) has means for reducing a pressure differential between the lubricant in the interior of motor 19 and the well fluid on the exterior. The dielectric lubricant within capsule chamber 51 will thus be at a pressure close to or equal with the well fluid pressure on the exterior of capsule 49.

Figure 3:
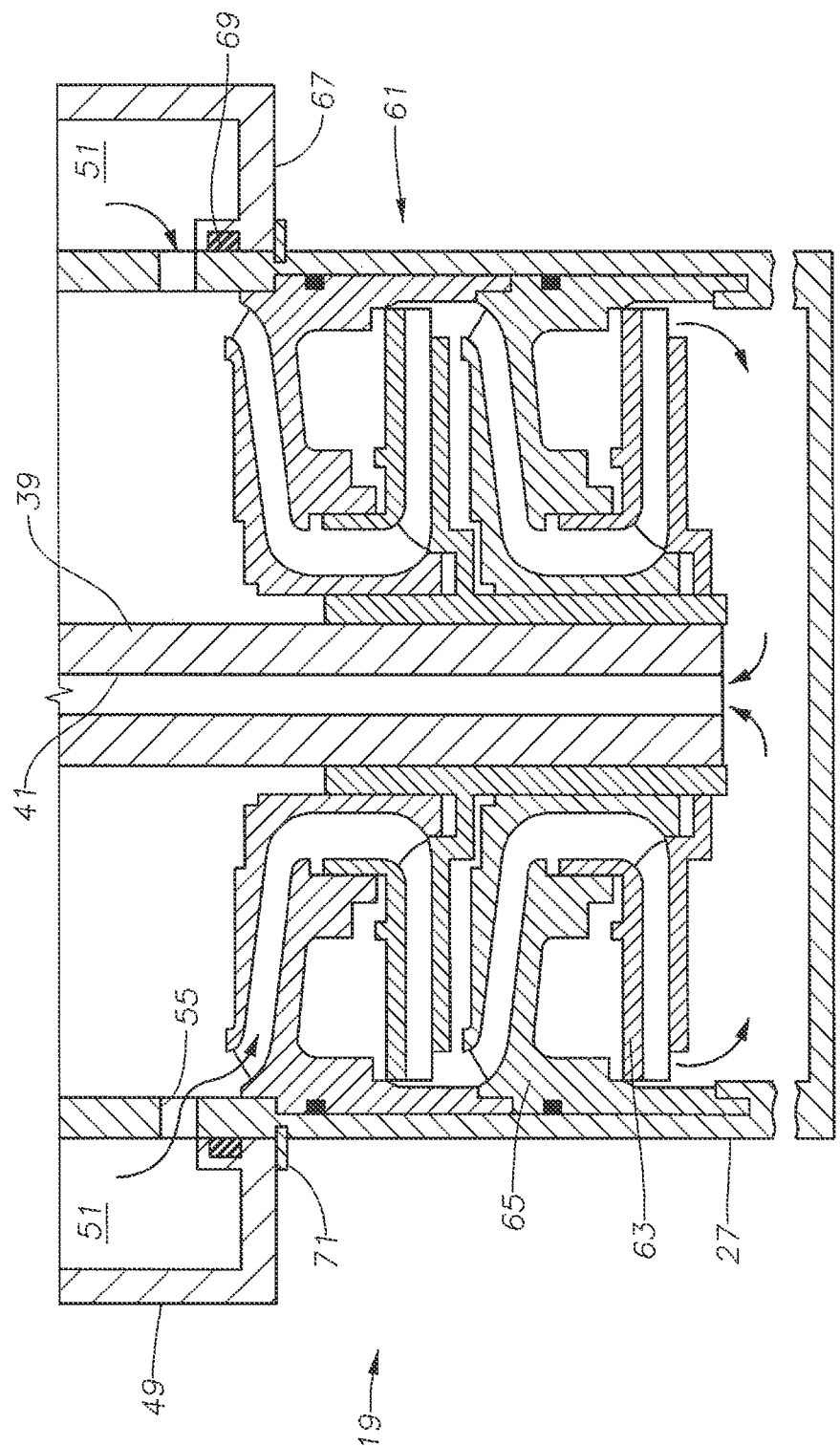
FIG. 3 is a side sectional view of a lower portion of the motor of FIG. 1.

Referring to FIG. 3, optionally a lubricant pump 61 may circulate the dielectric lubricant through motor 19 and capsule 49. In this example, lubricant pump 61 is mounted within motor housing 27 below stator 29 and driven by shaft 39. Lubricant pump 61 has at least one stage (two shown), each stage having an impeller 63 and diffuser 65. Impellers 63 are inverted so that they pump lubricant downward and back up shaft passage 41. Lubricant flows from capsule chamber 51 into lubricant pump 61 from lower ports 55. Some of the lubricant flowing up shaft passage 41 flows out upper ports 53 (FIG. 2) into capsule chamber 51. Many varieties of lubricant pumps could be employed.

FIG. 3 also schematically shows one method of attaching and sealing capsule 49 to motor housing 27. Capsule 49 has a lower flange 67 that extends radially inward from the outer side wall of capsule 49 into abutment with the exterior of motor housing 27. An O-ring 69 seals the inner diameter of flange 67 to motor housing 27. A snap ring 71 engages a groove in motor housing 27 and abuts lower flange 67 to retain capsule 49 on motor housing 27. The upper end of capsule 49 may be connected and sealed to motor housing 27 in the same manner as shown in FIG. 3.

In operation, the operator lowers ESP 11 into the well assembled as shown in FIG. 1. Three-phase electrical power supplied via power cable 25 causes motor 19 to drive pump 15. As motor 19 operates, windings 33 (FIG. 2) generate heat. Also, the well can be quite hot, particularly in steam assisted gravity applications (SAGD), where steam is injected into horizontal sections of a cased well to facilitate the flow of very viscous well fluid.

DC electrical current supplied via wire 47 to thermoelectric devices 43 causes the inner sides 43c to cool, transferring heat from motor housing 47 to thermoelectric devices 43. The heat flows through thermoelectric devices 43 to the outer sides 43d. The outer sides 43d transfer the heat absorbed to the dielectric lubricant in capsule chamber 51, which serves as a heat sink. If lubricant pump 61 is employed, the lubricant circulates past thermoelectric devices 43, assisting in removing heat from the outer sides 43d and dissipating the heat from the lubricant.

Although the technology herein has been described with reference to particular embodiments, it is to be understood that these embodiments are merely illustrative of the principles and applications of the present technology. It is therefore to be understood that numerous modifications may be made to the illustrative embodiments and that other arrangements may be devised without departing from the spirit and scope of the present technology.

The invention claimed is:

1. An electric submersible well pump assembly, comprising:
    a pump;
    an electrical motor operatively connected to the pump for causing the pump to pump well fluid in which the pump and the motor are submersed;
    at least one thermoelectric device mounted to an exterior portion of the motor, the thermoelectric device adapted to provide cooling upon receiving electrical current;
    a capsule surrounding a housing of the motor, the capsule having a larger inner diameter than an outer diameter of the housing of the motor, defining a chamber in which the at least one thermoelectric device is located; and
    the chamber being sealed from the well fluid in which the pump and the motor are submersed and filled with a dielectric liquid that immerses the thermoelectric device.

2. The assembly according to claim 1, further comprising:
    a dielectric liquid pump that circulates the dielectric liquid in the chamber.

3. The assembly according to claim 1, wherein:
    the motor also contains the dielectric liquid; and
    a communication passage communicates the dielectric liquid within the motor with the dielectric liquid in the chamber.

4. The assembly according to claim 3, further comprising:
    a dielectric liquid pump in the motor that circulates the dielectric liquid within the motor into and out of the chamber.

5. The assembly according to claim 1, wherein the at least one thermoelectric device has an inner side in contact with the housing of the motor.

6. The assembly according to claim 1, wherein the at least one thermoelectric device comprises a plurality of thermoelectric devices, spaced apart from each other around the housing of the motor.

7. The assembly according to claim 1, wherein the at least one thermoelectric device comprises a plurality of thermoelectric devices mounted to the housing of the motor within a plurality of rows, each of the rows extending circumferentially around the housing of the motor.

8. The assembly according to claim 1, further comprising:
    a wire extending sealingly into the capsule to the at least one thermoelectric device for supplying power to the thermoelectric device.

9. The assembly according to claim 1, further comprising:
    an electrical power cable extending alongside the pump to the motor, the power cable adapted to be connected to a power source at a wellhead for supplying power to the motor and to the at least one thermoelectric device.

10. An electric submersible well pump assembly, comprising:
    a pump;
    an electrical motor operatively connected to the pump for submersion in a well fluid along with the pump, the motor being filled with a dielectric lubricant;
    a capsule surrounding a housing of the motor for submersion in the well fluid along with the pump and the motor, the capsule having a larger inner diameter than an outer diameter of the housing of the motor, defining a chamber between the capsule and the motor, the chamber being sealed from the well fluid in which the pump and motor are submersed;
    a plurality of thermoelectric devices located within the chamber;
    electrical wires leading to the thermoelectric devices to provide a voltage, which causes cooling of the thermoelectric devices;
    an inlet port and an outlet port extending through a side wall of the housing of the motor into the chamber, communicating the lubricant within the motor to the chamber for cooling the lubricant; and wherein
    the thermoelectric devices are immersed in the lubricant within the chamber.

11. The assembly according to claim 10, further comprising:
    a lubricant pump in the motor that circulates the lubricant within the motor through the inlet port, through the chamber, and out the outlet port back into the motor.

12. The assembly according to claim 10, wherein each of the thermoelectric devices has an inner side in contact with the housing of the motor.

13. The assembly according to claim 10, wherein the thermoelectric devices are spaced apart from each other and extend in a circumferential row around the housing of the motor.

14. The assembly according to claim 10, wherein the thermoelectric devices are mounted to the housing of the motor within a plurality of rows, each of the rows extending circumferentially around the housing of the motor.

15. The assembly according to claim 10, further comprising:
    a protective member mounted to the motor and having means for reducing a pressure differential between the lubricant in the motor, the lubricant in the chamber, and the well fluid in which the pump and the motor are submersed.

16. The assembly according to claim 10, further comprising:
an electrical power cable extending alongside the pump to the motor, the power cable adapted to be connected to a power source at a wellhead for supplying power to the motor, the wires leading to the thermoelectric devices extending sealingly through the capsule and being connected to the power cable.

17. A method of pumping well fluid with an electrical submersible pump having an electrical motor, comprising:
mounting a capsule around a housing of the motor, the capsule having a larger inner diameter than an outer diameter of the housing of the motor, defining a chamber between the housing of the motor and the capsule, and sealing the chamber from well fluid in which the pump and motor are submersed;
mounting at least one thermoelectric device to housing of the motor within the chamber;
filling the chamber with a dielectric liquid;
submersing the motor, the capsule, and the pump in well fluid and supplying power to the motor to drive the pump; and
supplying a voltage to the at least one thermoelectric device, thereby causing cooling of the at least one thermoelectric device and a heat transfer of heat from the motor through the at least one thermoelectric device to the dielectric liquid in the capsule and from the dielectric liquid in the capsule to the well fluid on the exterior of the capsule.

18. The method according to claim 17, further comprising:
filling the motor with the same dielectric liquid as in the chamber; and
communicating the dielectric liquid in the motor with the dielectric liquid in the chamber.

19. The method according to claim 17, further comprising:
filling the motor with the same dielectric liquid as in the chamber; and
communicating the dielectric liquid in the motor with the dielectric liquid in the chamber; and
reducing a pressure differential between the dielectric liquid in the motor and the dielectric liquid in the chamber with the well fluid on the exterior of the chamber.

20. The method according to claim 19, further comprising:
with a dielectric liquid pumping device, circulating the dielectric liquid in the motor into the chamber and back into the motor.

* * * * *